(12) United States Patent
Loibl et al.

(10) Patent No.: US 6,300,565 B1
(45) Date of Patent: Oct. 9, 2001

(54) CONTROLLER FOR A MOTOR VEHICLE

(75) Inventors: Josef Loibl, Regen; Ulf Scheuerer, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/407,255

(22) Filed: Sep. 28, 1999

Related U.S. Application Data

(63) Continuation of application No. PCT/DE98/00771, filed on Mar. 13, 1998.

(30) Foreign Application Priority Data

Mar. 26, 1997 (DE) .............................. 197 12 842

(51) Int. Cl.$^7$ ...................................................... H05K 5/06
(52) U.S. Cl. ..................... 174/52.3; 174/59; 174/52.1; 439/76.2
(58) Field of Search .................... 257/698, 693; 174/52.1, 52.3, 59; 361/807, 809; 439/76.2

(56) References Cited

U.S. PATENT DOCUMENTS 5,252,782 * 10/1993 Cantrell et al. ..................... 174/35 R
5,347,160 * 9/1994 Sutrina ................................. 257/698

FOREIGN PATENT DOCUMENTS

| 2841443 | 4/1980 | (DE) . |
| 4102265A1 | 7/1992 | (DE) . |
| 29501849 | 5/1995 | (DE) . |
| 0519202A1 | 12/1992 | (EP) . |

OTHER PUBLICATIONS

Published International Application No. 95/00363 (Jakob et al.), dated Jan. 5, 1995.

* cited by examiner

Primary Examiner—Dean A. Reichard
Assistant Examiner—Hung V Ngo
(74) Attorney, Agent, or Firm—Herbert L. Lerner; Laurence A. Greenberg; Werner H. Stemer

(57) ABSTRACT

A controller for a motor vehicle has a base plate, a conductor track substrate fitted on the base plate, an electronic circuit and a housing cover which is connected to the base plate in a contact region and is made of plastic. The housing cover furthermore encases electrical conductors. One conductor end of an electrical conductor projects out of the housing cover in a contact region and projects into an opening in the base plate, by which an electrical connection is produced with the conductor track substrate.

14 Claims, 6 Drawing Sheets

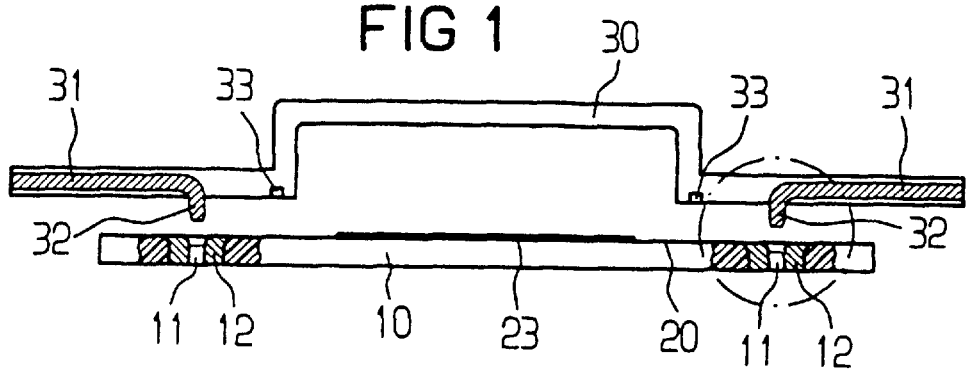
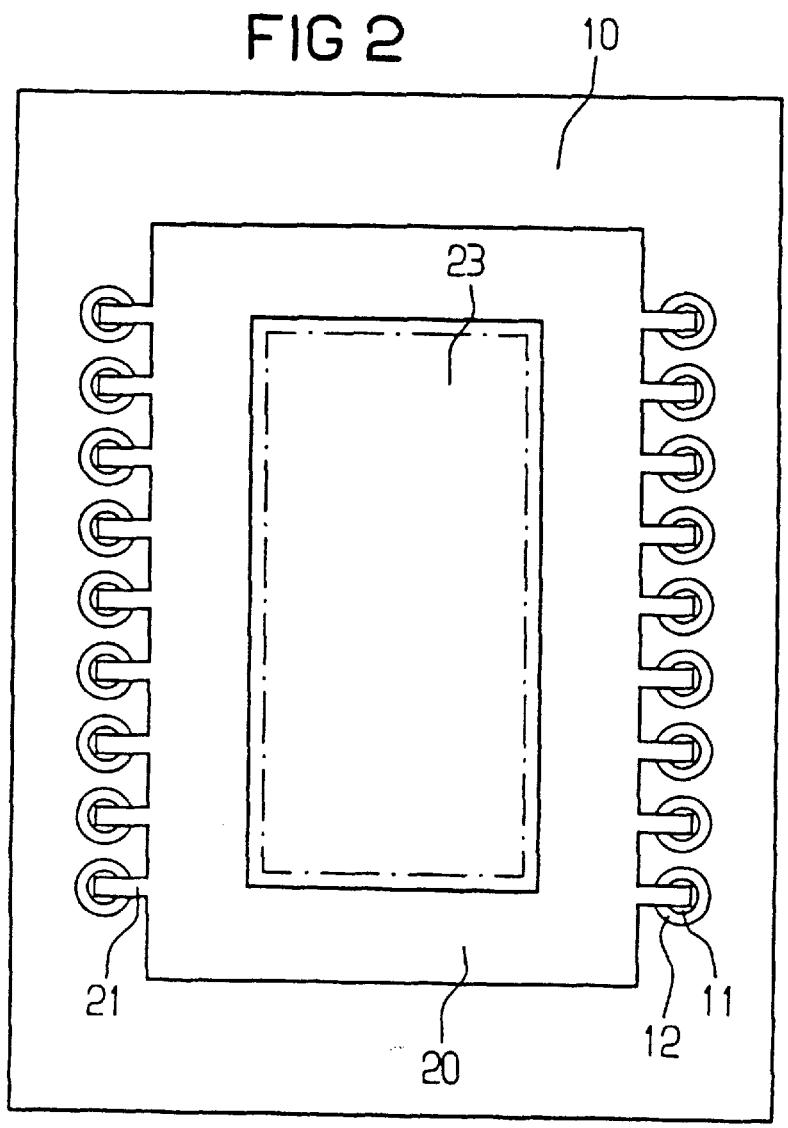

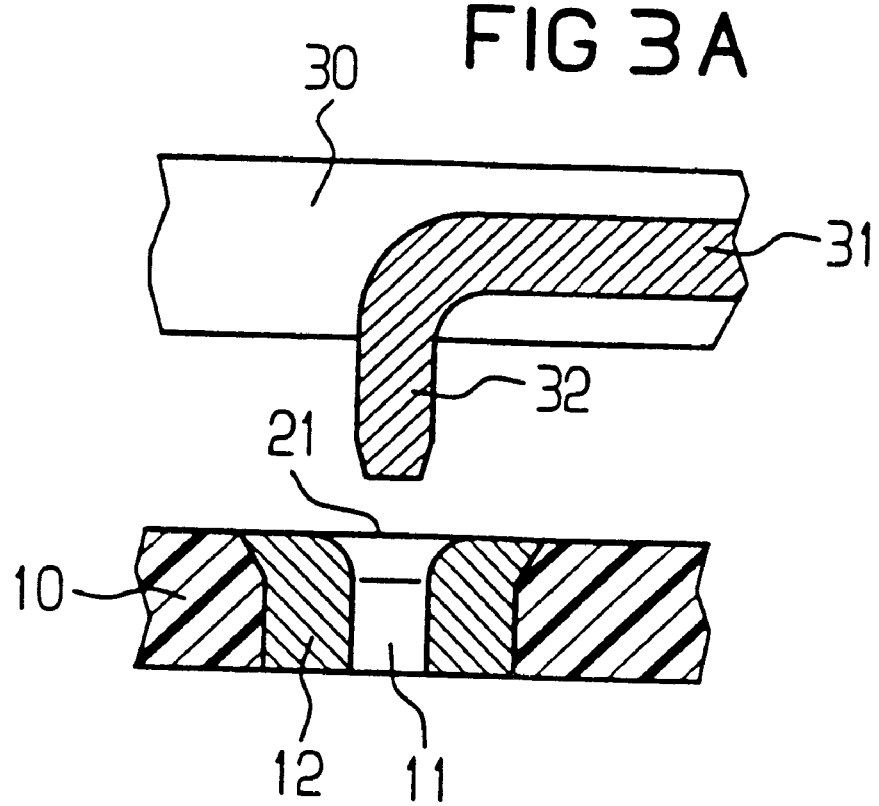
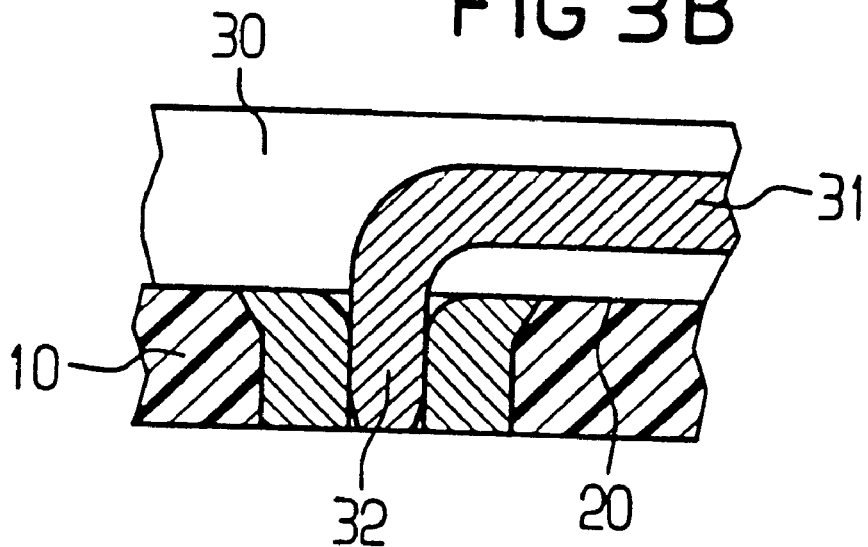

CONTROLLER FOR A MOTOR VEHICLE

CROSS-REFERENCE TO RELATED APPLICATION

This application is a continuation of copending International Application PCT/DE98/00771, filed Mar. 13, 1998, which designated the United States.

BACKGROUND OF THE INVENTION

FIELD OF THE INVENTION

The invention relates to a controller for a motor vehicle. The controller is formed of a base plate, a conductor track substrate disposed on the base plate, an electronic circuit connected to the conductor track substrate and a housing cover connected to the base plate in a contact region of the base plate. Such a controller is disclosed in Published, Non-Prosecuted German Patent Application DE 41 02 265 A1. This controller is distinguished by a housing of simple construction, which can be produced economically. A metal plate that is used as a heat sink is at the same time a part of the housing. The metal plate has a contact region with further housing parts only on one side. The controller is connected externally via a plug. The plug must also be mounted on the metal plate, and its connecting pins must be inserted into a conductor track substrate, and must be soldered there.

German Utility Model DE 295 01 849 U1 discloses a plastic housing, through whose walls electrical supply cables are passed. The ends of the supply cables project freely into the housing interior, where they are pressed into holes in a printed circuit board, by which the printed circuit board is mechanically held and is made contact with electrically.

Published, Non-Prosecuted German Patent Application DE 28 41 443 A1 discloses a printed circuit board which contains two thick layers of a base material. The upper layer has a metal coating on the underneath. The base material is cut away at the contact-making points. When components are being fitted to the printed circuit board, the connecting wires are pressed into the contact-making points. The wires pass through the metal coating, with a clawing action in the process.

SUMMARY OF THE INVENTION

It is accordingly an object of the invention to provide a controller for a motor vehicle that overcomes the above-mentioned disadvantages of the prior art devices and methods of this general type, in which an electronic circuit which is fitted on a conductor track substrate is connected in a particularly simple manner to electrical connections.

With the foregoing and other objects in view there is provided, in accordance with the invention, a controller for a motor vehicle, including:

a base plate having a housing contact region;

a conductor track substrate having a conductor track disposed on the base plate;

an electronic circuit electrically connected to the conductor track substrate;

a housing cover made of plastic and connected to the base plate in the housing contact region; and electrical conductors having conductor ends encased and guided in the housing cover, one conductor end of the electrical conductors ends projects out of the housing cover in a direction of the base plate and produces an electrical connection to the conductor track on the conductor track substrate.

In one preferred embodiment, the electrical conductors, which project out of the housing cover and project into the baseplate or bottom plate, at the same time produce a mechanical connection between the housing cover and the base plate, and an electrical connection between the outside of the housing and the electronic circuit. Thus, the assembly of the housing and the electrical contact are produced at the same time just by fitting the housing cover onto the base plate. In this case, there is no need for any soldering process. The electrical connection produced in this way is reliably protected against any short circuit produced by metal swarf.

In order to improve reliability, or if there is no mechanical connection by the conductor, a connection between the base plate and housing cover can be made, for example, by riveting, screwing or pressing.

One preferred field of application for the invention is the integration of control electronics in an automatic transmission for fully-integrated transmission control. In this case, the control electronics are disposed on a circuit board that is located within the oil sump of the transmission.

The controller is particularly suitable for systems in which stamped grids must be connected to an electronic circuit in the controller. The stamped grids may in this case also be replaced by simple electrical wires.

Other features which are considered as characteristic for the invention are set forth in the appended claims.

Although the invention is illustrated and described herein as embodied in a controller for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a housing cover which has been fitted onto a base plate according to the invention;

FIG. 2 is a plan view of the base plate on which a flexible film has been fitted;

FIG. 3a is a fragmentary, sectional view of a wire end projecting out of the housing cover, before it is pressed into a hole in the base plate;

FIG. 3b is a fragmentary, sectional view of the wire end after it has been pressed into the hole;

FIGS. 4a to d are enlarged, plan views of four different configurations of a conductor track in a region of the hole, before the wire end or stamped grid is pressed in;

DESCRIPTION OF THE PREFERRED EMBODIMENTS

Figure 4A:
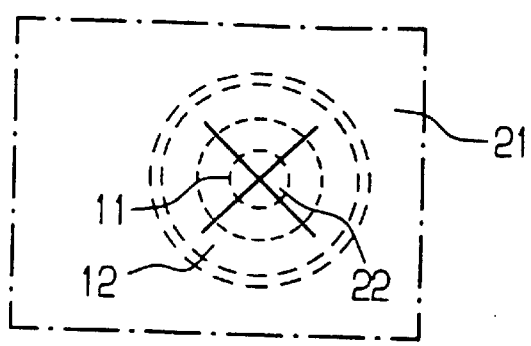

In all the figures of the drawing, sub-features and integral parts that correspond to one another bear the same reference symbol in each case. Referring now to the figures of the drawing in detail and first, particularly, to FIG. 1 thereof, there is shown a housing cover 30 made of plastic, which is configured as a supporting body for a control housing of an automatic transmission. Such a supporting body 30 is mounted on a hydraulic circuit board, and holds electrical conductors, sensors and a plug connector. These components are located outside a cavity formed for control electronics 23 or an electronic circuit 23.

During the production of the housing cover 30 and supporting body, electrical conductors are either directly inserted into an injection tool, or they are fixed in their relative position with respect to one another in advance, for example by spraying on plastic webs (initial extrusion coating), and are subsequently extrusion coated in the spraying tool.

The conductors are configured as electrical wires 31 and are connected to magnet coils, a plug connector and sensors, as described in German Patent DE 43 44 584 C2. The electrical wires 31 run in the housing cover 30 from external components, such as plug connectors, sensors and the like, in the direction of the electronic circuit 23. In a section outside the electronic circuit 23, wire ends 32 project out of the housing cover 30. A circumferential seal 33 is fitted to the housing cover 30 to provide a seal against transmission oil.

A metallic base plate 10 has openings or holes 11 in an edge region. Insulating sleeves configured as push-in sleeves 12 are introduced into the holes 11. A central region of the base plate 10 is covered by a conductor track substrate 20 configured as a flexible polyimide film 20.

The flexible film 20 is connected to the electronic circuit 23. The housing interior, in which the electronic circuit 23 is accommodated, is essentially formed by a trough-shaped section of the housing cover 30. The overall housing is formed of only the housing cover 30 (supporting body) and the base plate 10. The complexity for the overall housing is minimized, since the metallic base plate 10 is just fitted on the supporting body 30, which exists in any case in an automatic transmission, and is at the same time the heat sink for the electronic circuit 23.

Although the seal 33, which is located between the housing cover 30 and the base plate 10, is integrated in the housing cover 30, it can also be integrated on the flexible film 20, for example by being sprayed on. The circumferential seal 33 is located further in the direction of the housing interior than the holes 11 or openings. The holes 11 and the electrical wires 31 running in the housing cover 30 thus do not need to be sealed against oil, in order to protect the electronic circuit 23 from the ingress of oil.

From FIG. 2, it can be seen that the conductor tracks 21 on the flexible film 20 continue into a region of the holes 11.

The flexible film 20 is laminated on the metallic base plate 10 such that it is oil-resistant. To this end, an acrylic-adhesive film is inserted between the base plate 10 and the polyimide film, and is heated under pressure so that a bond is produced between the base plate 10, the acrylic and the polyimide. The flexible film 20 is preferably provided with the acrylic-adhesive film even before it is fitted on the base plate 10.

The electronic circuit 23 is preferably fitted on a ceramic circuit substrate. For assembly at an optimum temperature, a circuit substrate is bonded with the electronic circuit 23 onto a surface of the metallic base plate 10 that is not covered by the flexible film 20, using a thermally conductive adhesive. The dashed lines in FIG. 2 indicate a raised region on the base plate 10, to which the flexible film 20 is adjacent. In an overlap zone, the circuit substrate projects beyond the raised region, and is bonded there to the film 20 using an electrically conductive adhesive, so that an electrical connection is produced between the conductor tracks 21 on the flexible film 20 and the electronic circuit 23.

The wire end 32, or connecting end of the electrical wire 31, shown in FIG. 3a projects essentially at right angles away from the housing cover 30 in the direction of the base plate 10. The elastic push-in sleeve 12 that is inserted into the hole 11 and is made of plastic has a cut at the rear so that, when the wire end 32 is pushed in, it can absorb the compression forces exerted on it. One suitable plastic for the push-in sleeve 12 is polyamide. There is a negative fit between the opening in the push-in sleeve and a wire end. In a corresponding manner to the cut in the rear of the push-in sleeve, the hole 11 has a recess on the side facing the housing cover 30. For protection against swarf from the transmission, the push-in sleeve 12 is closed in the direction of the side facing away from the housing cover 30 (not shown). The push-in sleeve is made of an electrically insulating material.

In FIG. 3b, the wire end 32 has been inserted into the push-in sleeve 12. During the insertion process, the conductor track 21 on the flexible film 20 is pushed into the push-in sleeve 12 by the wire end 32. The friction contact between the push-in sleeve 12 and the wire end 32 produces not only a mechanical clamped connection between the housing cover 30 and the base plate 10, but also an electrical connection between the wire 31 and the conductor track 21 on the flexible film 20. An electrical connection is thus produced between the wire 31 and the electronic circuit 23.

In FIG. 4a, the conductor track 21 covers the push-in sleeve 12. The dashed lines show the concealed edges of the outer circumference of the push-in sleeve 12, the cut at the rear of the push-in sleeve 12, a flattened region (running into the hole) on the push-in sleeve, and the hole 11.

The conductor track 21 has x-shaped slots in the region of the push-in sleeve 12. The conductor track 21 thus has four tongues 22 that are drawn into the push-in sleeve 12 when a wire end 32 is pushed in. This results in a very firm and reliable electrical and mechanical connection, which also satisfies the environmental requirements in a transmission with respect to oil, vibration and temperature change.

Figure 4B:
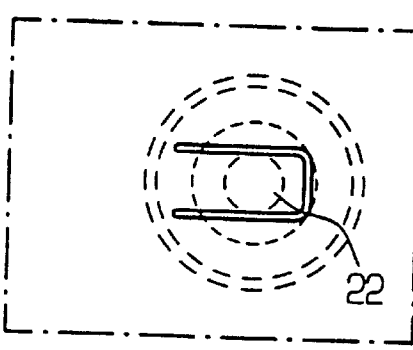

In FIG. 4b, the hole 11 is covered by a single elongated tongue 22.

Figure 4C:
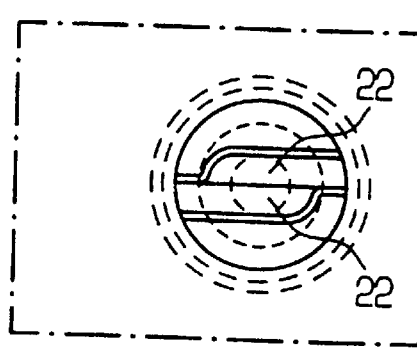

In FIG. 4c, two wing-like tongues 22 are formed, which are forced apart from one another when the wire end 32 is inserted.

Figure 4D:
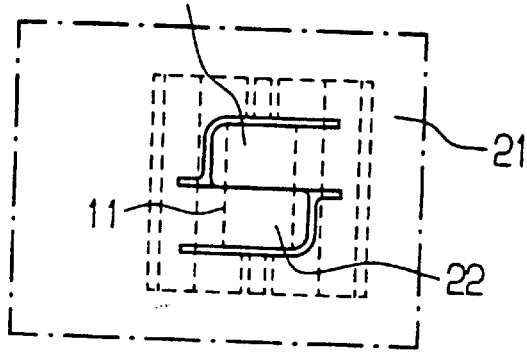

In FIG. 4d, the conductor track 21 covers the opening 11 in the form of a slot. Such openings in the form of slots are expedient when the electrical conductors held by the housing cover are stamped grids. Two tongues 22 pointing in opposite directions are shown, and are each aligned at right angles to the slot.

Figure 5:
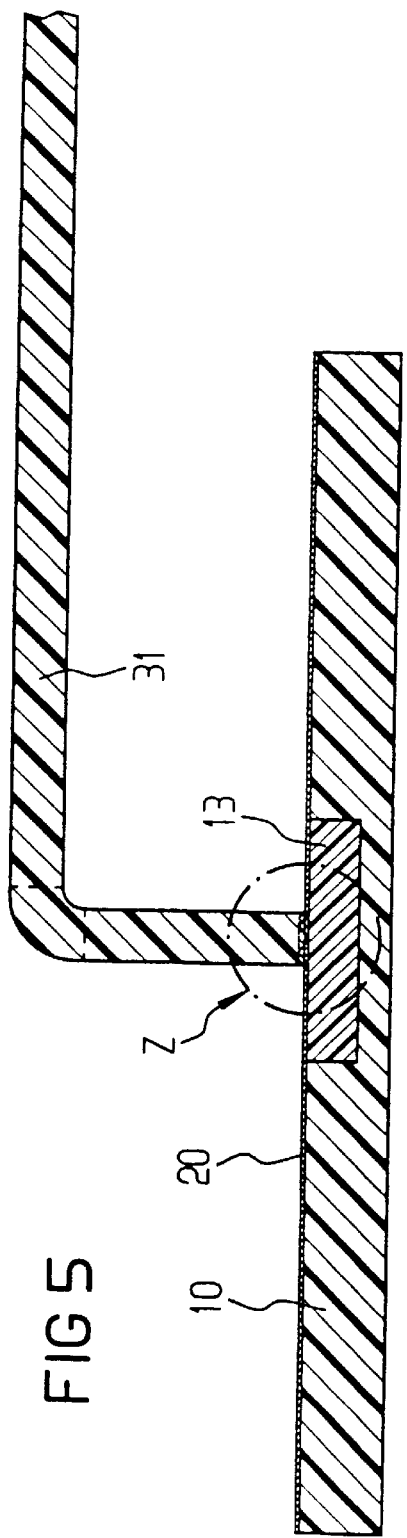
FIG. 5 is a sectional view of the wire end whose end face makes contact with the conductor track.

FIG. 5 shows a contact between the wire end 32 and the flexible film 20. The wire end 32 presses in an axial direction onto a contact pad on the conductor track on the flexible film. To provide protection against a short circuit between the wire end 32 and the metallic base plate 10, an insulating panel 13 made of plastic is integrated in the base plate 10, in the contact region. This prevents any electrical contact between the wire end 32 and the metallic base plate 10 if the flexible film is damaged.

An electrical contact between the electrical wires 31 and the flexible film 20, and thus a control circuit, can be produced just by mechanically connecting the base plate 10 to the housing cover 30. No bonding or soldering process is required. The housing cover 30, which holds the electrical wire 31, is not illustrated, in order to make the illustration particularly clear.

Figure 6:
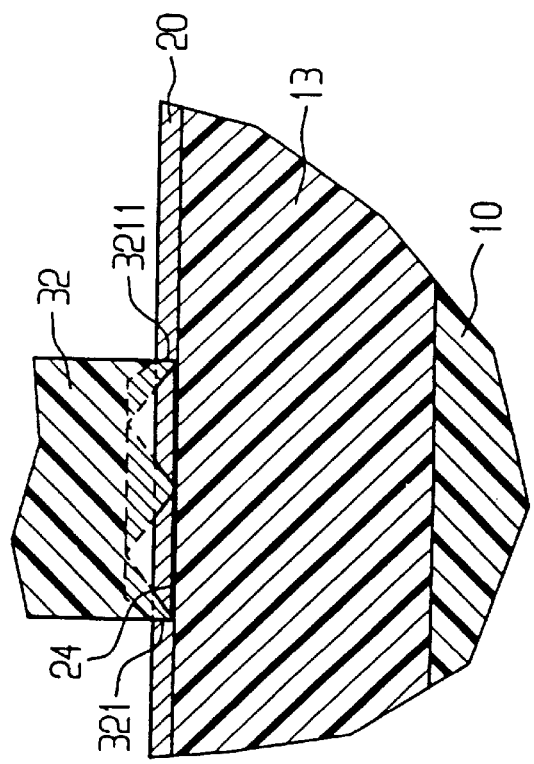
FIG. 6 is an enlarged, sectional view of a region denoted by Z in FIG. 5.

In FIG. 6, it can be seen that an end face 321 of the wire end 32 facing a contact pad 24 on the flexible conductor track film 20 has sharp projections 3211 or edges, so that the wire end 32 digs itself into a surface of the contact pad 24. The wire end 32 projects out of the housing cover 30.

In order to ensure permanent contact between the wire end 32 and the flexible film 20 not only with regard to loads from the environment but also with regard to aging, an elastic element is used to produce a spring effect. The elastic element may either be a free part of the electrical wire 31 which is not encased by the housing and/or the insulating panel 13 which is configured to be elastic. The electrical contact is made by pressing the wire end 32 in the axial direction against a contact pad on the conductor track. The base plate 10 and the housing cover 30 are mechanically fixed separately from the electrical contact-making process, for example by screws or rivets.

If the electrical wire 31 or its wire end 32 is constructed to be elastic, then the wire end 32 which projects beyond the contact surface of the housing cover 30 is pushed back during the process of connection to the base plate 10 and when axial pressure is applied to the wire. In consequence, the wire end 32 exerts a compressive stress on the contact pad on the conductor track (which is not shown) on the flexible film 20.

An adhesive layer is applied between the base plate 10 and the contact pad on the conductor track. The base film of the flexible film 20 is made of polyimide.

A spring effect provided by the elastic insulating panel 13 can be optimized if a recess is incorporated in the base plate 10, under the insulating panel 13.

A top surface of the insulating panel 13 forms a plane with the base plate 10, so that the flexible film 20 can be bonded on flat.

Figure 7:
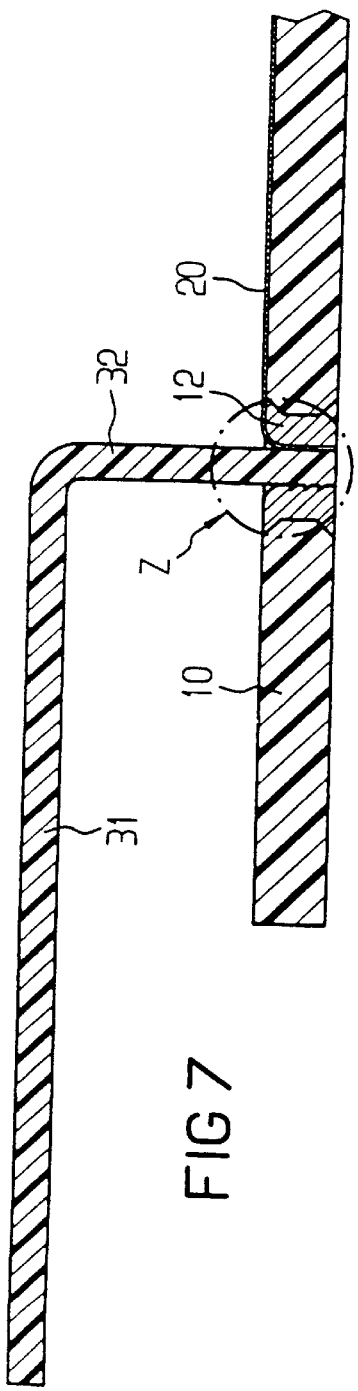
FIG. 7 is a sectional view of the wire end anchored by teeth in the base plate.
Figure 8:
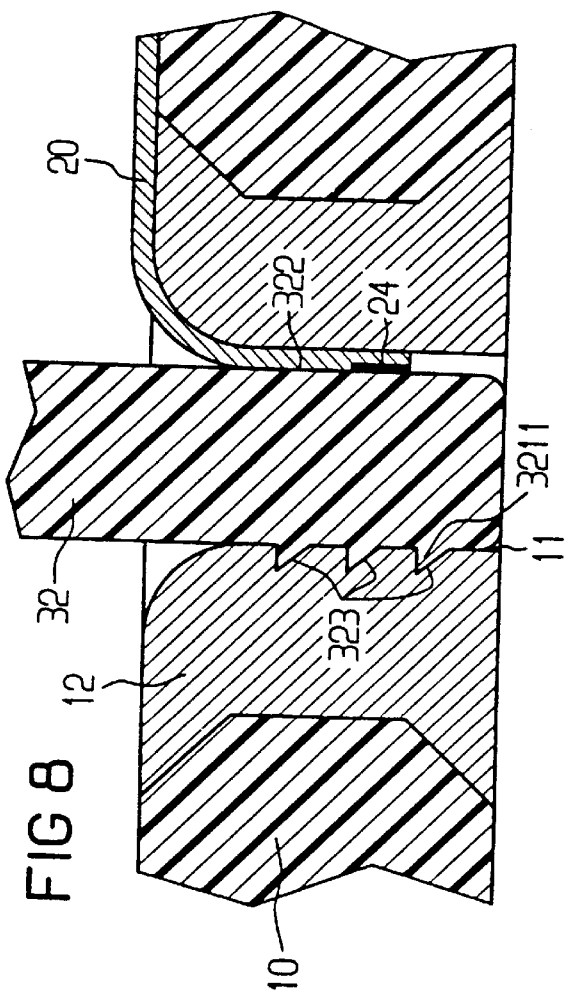
FIG. 8 is an enlarged, sectional view of the region denoted by Z in FIG. 7.

FIGS. 7 and 8 show the electrical contact and the mechanical fixing being produced simultaneously by use of one end of the conductor or wire end 32. The wire end 32 has a contact section 322 (configured to be smooth) for a conductor track on the flexible film 20, and a specially configured engagement section 323 for the hole 11 and, to be more precise, for the push-in sleeve 12. The conductor or electrical wire 31 thus has a separate engagement section for mechanically fixing the base plate 10 on the housing cover 30, and this engagement section does not adversely affect the electrical contact.

The wire end 32 configured in such a manner can be used for the equipment illustrated in FIGS. 1 to 4.

From FIG. 8, it can be seen that the contact section 322 and the engagement section 323 are physically separated from one another. The contact region is configured to be smooth in the axial direction over a region of the circumference of the wire end 32, in order to make contact with the contact pad 24 on the conductor track on the flexible film 20. The push-in sleeve 12 likewise has a smooth surface, at least at the corresponding point. This prevents the wire end 32 that is to be pushed into the base plate 10 or push-in sleeve 12 from shearing off the conductor track with which contact is to be made. The end face of the wire end should be configured to be rounded or hemispherical. In addition, the contact region of the conductor track film is coated with a lubricant. Tin, for example, is suitable for this purpose.

In another region of the circumference, the wire end 32 is configured in such a manner that it causes considerable material displacement, thus producing a fixing with high mechanical strength, while being pushed into the base plate 10 and, specifically, while being pushed into the plastic push-in sleeve 12. Teeth or projections 3211 are disposed in the axial direction in this region of the circumference. The teeth or projections 3211 form a section of a ring. When the wire end 32 is being pushed in, the projections 3211 do not come into contact with the conductor track, even though they can be disposed, or can intersect, at the same level in the axial direction.

The wire end 32 has an essentially constant diameter over its entire length. The wire end 32, which is configured as a plug-in pin, is machined, in particular stamped, to form a projection 3211.

Figure 9:
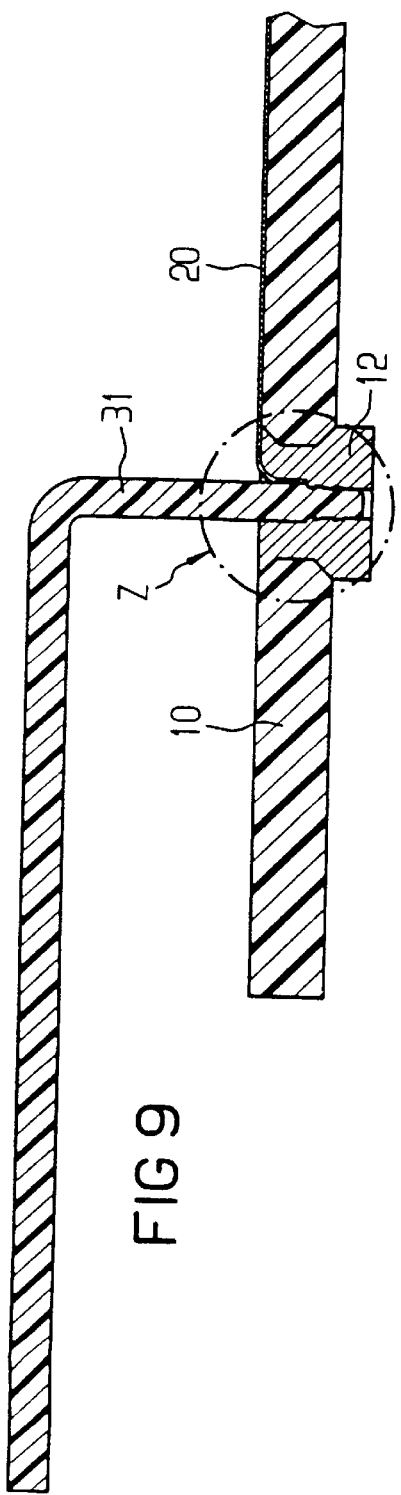
FIG. 9 is a sectional view of a further embodiment of the wire end anchored by use of the teeth in the base plate.

The wire end 32 shown in FIG. 9 has the engagement section 323 with the annular projections 3211 or teeth, which engagement section 323 is disposed at a different level from the contact section 322 in the axial direction. The electrical contact is made in a section of the wire end that points in the direction of the inside of the base plate 10, which is covered by the housing cover (not shown). The engagement section 323 is located underneath this.

Figure 10:
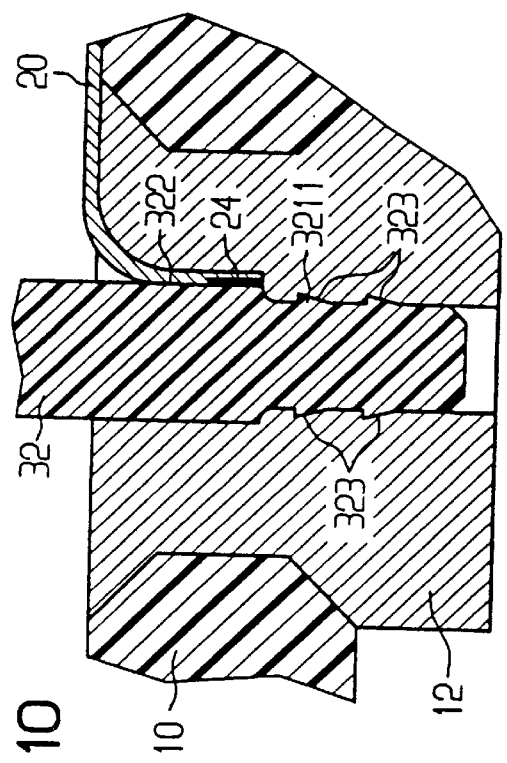
FIG. 10 is an enlarged, sectional view of the region denoted by Z in FIG. 9.

From FIG. 10, it can be seen that the wire end 32 has a larger diameter in the contact section 322 than in the engagement region. The push-in sleeve 12 is correspondingly provided with a narrower opening in the region intended for mechanical fixing. During assembly of the housing, the wire end 32 can thus draw the flexible film 20 with the conductor track 21 into the push-in sleeve 12, but does not exert any significant shear forces on it. No contact pressure is exerted on the flexible film 20 or the corresponding contact pad 24 on a conductor track until the contact section 322 has entered the push-in sleeve.

Since no bonding, welding, riveting or screwing processes are required for the wire ends 32 to engage in the holes 11 this results in major savings in the manufacture of the controller in such embodiments.

When used as a controller that is completely integrated in a transmission, no additional swarf protection is required to prevent electrical short circuits. In comparison with previously known oil-tight housings, there are no contact-making tabs or push-in pins required to seal the housing from the transmission oil.

We claim:

1. A controller for a motor vehicle, comprising:

a base plate defining an opening and having a housing contact region;

a conductor track substrate having a conductor track disposed on said base plate;

an electronic circuit electrically connected to said conductor track substrate;

a housing cover made of plastic and connected to said base plate in said housing contact region; and electrical conductors having conductor ends encased and guided in said housing cover, one conductor end of said electrical conductors projects out of said housing cover in a direction of said base plate and into said opening in said base plate, said conductor end makes contact with said conductor track there and produces an electrical connection to said conductor track on said conductor track substrate.

2. The controller according to claim 1, wherein said conductor end has an end face for producing said electrical connection to said conductor track in a region in which said conductor track is supported by said base plate.

3. The controller according to claim 1, wherein said conductor end has an end face with at least one projection.

4. The controller according to claim 1, including a circumferential seal disposed between said base plate and said housing cover.

5. The controller according to claim 1, wherein said conductor ends attach said housing cover to said base plate by friction.

6. The controller according to claim 1, including an insulating bush disposed in said opening in said base plate.

7. The controller according to claim 6, wherein said conductor end has a contact section for making electrical contact with said conductor track of said conductor track substrate and has an engagement section for mechanically fixing one of said base plate and said insulating bush.

8. The controller according to claim 1, wherein said conductor track substrate is a flexible film.

9. The controller according to claim 1, wherein said conductor ends project out of said housing cover in a contact region between said base plate and said housing cover.

10. The controller according to claim 1, wherein said housing cover is a load-bearing part of a housing of a controller disposed in one of an engine compartment of a motor vehicle and in an automatic transmission full of oil.

11. A method for producing a controller, which comprises:

providing a base plate having openings formed therein;

applying a conductor track substrate having conductor tracks to the base plate;

disposing an electronic circuit on the base plate;

connecting the conductor track substrate to the electronic circuit;

forming a housing cover made of plastic and having electrical conductors held therein such that conductor ends of the electrical conductors project out of the housing cover; and assembling the housing cover and the base plate such that the conductor ends project into the openings in the base plate and produce an electrical contact with the conductor tracks on the conductor track substrate.

12. The method according to claim 11, which comprises:

applying the conductor track substrate to the base plate such that the conductor tracks on the conductor track substrate extend into a region of the openings on the base plate; and inserting the conductor ends into the openings in the base plate and producing the electrical contact with the conductor tracks there during the assembling step.

13. The method according to claim 12, wherein the conductor ends produce not only the electrical contact with the conductor tracks but also an only mechanical connection between the housing cover and the base plate.

14. The method according to claim 12, which comprises:

covering one of the openings of the base plate with one of the conductor tracks on the conductor track substrate; and incorporating at least one tongue in each of the conductor tracks in a region of each of the openings, the at least one tongue being bent into an opening of the openings, at the latest, when a conductor end of the conductor ends is inserted in the opening and produces the electrical contact with the electrical conductor.

* * * * *

UNITED STATES PATENT AND TRADEMARK OFFICE
CERTIFICATE OF CORRECTION

PATENT NO. : 6,300,565 B1
DATED : October 9, 2001
INVENTOR(S) : Josef Loibl et al.

It is certified that error appears in the above-identified patent and that said Letters Patent is hereby corrected as shown below:

<u>Title page,</u>
Item [75] should read as follows:
-- Josef Loibl, Regen; Ulf Scheurer, Regensburg; Frank Franzen, Regensburg, all of (DE). --

Signed and Sealed this

Fourteenth Day of May, 2002

*Attest:*

JAMES E. ROGAN
*Attesting Officer*     *Director of the United States Patent and Trademark Office*